United States Patent
Cook et al.

(10) Patent No.: US 9,620,329 B1
(45) Date of Patent: Apr. 11, 2017

(54) ELECTROSTATIC MULTIPOLE DEVICE, ELECTROSTATIC MULTIPOLE ARRANGEMENT, CHARGED PARTICLE BEAM DEVICE, AND METHOD OF MANUFACTURING AN ELECTROSTATIC MULTIPOLE DEVICE

(71) Applicant: ICT Integrated Circuit Testing Gesellschaft für Halbleiterprüftechnik mbH, Heimstetten (DE)

(72) Inventors: Benjamin John Cook, München (DE); Dieter Winkler, München (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 14/947,609

(22) Filed: Nov. 20, 2015

(51) Int. Cl.
  *H01J 37/00* (2006.01)
  *H01J 37/147* (2006.01)
  *H01J 37/153* (2006.01)
  *H01J 37/12* (2006.01)

(52) U.S. Cl.
  CPC .......... *H01J 37/1477* (2013.01); *H01J 37/12* (2013.01); *H01J 37/153* (2013.01); *H01J 2237/1516* (2013.01); *H01J 2237/1534* (2013.01)

(58) Field of Classification Search
  CPC . H01J 37/1477; H01J 37/28; H01J 2237/1516
  USPC ..................................................... 250/396 R
  See application file for complete search history.

(56) References Cited

U.S. PATENT DOCUMENTS

| | | | | |
|---|---|---|---|---|
| 6,563,124 B2* | 5/2003 | Veneklasen | ............ | B82Y 10/00 250/398 |
| 7,875,858 B2* | 1/2011 | Ito | .......................... | H01J 37/145 250/396 ML |
| 8,933,425 B1* | 1/2015 | Bevis | .................. | H01J 37/3174 250/396 R |

(Continued)

OTHER PUBLICATIONS

U.S. Appl. No. 14/947,568, Notice of Allowance mailed on Dec. 8, 2016, 8 pages.

(Continued)

*Primary Examiner* — Michael Maskell
(74) *Attorney, Agent, or Firm* — Kilpatrick Townsend & Stockton LLP

(57) ABSTRACT

An electrostatic multipole device for influencing a charged particle beam propagating along an optical axis is described. The multipole device includes a first electrical contact, a second electrical contact, and a high-resistance layer which extends at least partially around the optical axis and is configured to allow a current flow between the first electrical contact and the second electrical contact, wherein the first electrical contact contacts the high-resistance layer at a first circumferential position and is configured to provide a first potential to the first circumferential position, and wherein the second electrical contact contacts the high-resistance layer at a second circumferential position at an angular distance from the first circumferential position and is configured to provide a second potential to the second circumferential position. Further, an electrostatic multipole arrangement including two or more such multipole devices and a charged particle beam device are described.

20 Claims, 9 Drawing Sheets

(56) References Cited

U.S. PATENT DOCUMENTS

| | | | | |
|---|---|---|---|---|
| 2008/0230711 | A1* | 9/2008 | Platzgummer | B82Y 10/00 250/396 R |
| 2012/0273690 | A1* | 11/2012 | Wieland | G03F 7/2059 250/396 R |
| 2015/0371811 | A1* | 12/2015 | Ogawa | H01J 37/12 250/305 |

OTHER PUBLICATIONS

U.S. Appl. No. 14/947,241, Non-Final Office Action mailed on Dec. 5, 2016, 12 pages.

* cited by examiner

ELECTROSTATIC MULTIPOLE DEVICE, ELECTROSTATIC MULTIPOLE ARRANGEMENT, CHARGED PARTICLE BEAM DEVICE, AND METHOD OF MANUFACTURING AN ELECTROSTATIC MULTIPOLE DEVICE

TECHNICAL FIELD

Embodiments described herein relate to electrostatic multipole devices for influencing a charged particle beam, e.g. an electron beam, for example, for inspection system applications, testing system applications, defect review or critical dimensioning applications, surface imaging applications (SEM) or the like, as well as to methods of manufacturing an electrostatic multipole device. An electrostatic multipole device may be configured as a lens device, as a deflector device or as a beam shaping device for focusing or defocusing, shaping, deflecting, correcting aberrations and/or directing of a charged particle beam. Embodiments also relate to an electrostatic multipole arrangement including two or more electrostatic multipole devices, and to a charged particle beam device, particularly to a charged particle beam device provided as a multi-beam system. Specifically, embodiments relate to a scanning charged particle beam device comprising at least one electrostatic multipole device.

BACKGROUND

Modern semiconductor technology has created a high demand for structuring and probing specimens in the nanometer or even in the sub-nanometer scale. Micrometer and nanometer scale process control, inspection or structuring, is often done with charged particle beams, e.g. electron beams, which are generated, shaped, deflected and focused in charged particle beam devices, such as electron microscopes or electron beam pattern generators. For inspection purposes, charged particle beams offer superior spatial resolution compared to, e.g., photon beams because their wavelengths are shorter than the wavelengths of light beams.

Inspection devices using charged particle beams such as scanning electron microscopes (SEM) have many functions in a plurality of industrial fields, including, but not limited to, inspection of electronic circuits during manufacturing, exposure systems for lithography, detecting devices, defect inspection tools, and testing systems for integrated circuits. In such particle beam systems, fine probes with high current density can be used. For instance, in the case of an SEM, the primary electron (PE) beam generates particles like secondary electrons (SE) and/or backscattered electrons (BSE) that can be used to image and analyze a specimen.

One drawback of electron-beam based systems is the limited probe current within the focused spot. With increasing resolution (decreasing spot size), probe current is further decreased because of a reduced aperture angle for controlling the aberrations. Higher brightness sources can provide only limited improvements for the probe current, because of the electron-electron interactions. Many approaches have been made to reduced e-e interactions in electron beam systems, which are, for example, reduced column length and/or higher column energy combined with late deceleration of the electron beam to the final landing energy just in front of the sample. However, improvement of single electron beam throughput at required resolution is increasingly challenging. One approach to solve such problems is the use of multiple beams, which may be generated by a single source, within one column, which reduce the throughput by the number of beams.

Individually controlling, directing, deflecting, shaping, correcting, focusing, and steering the individual beamlets of such a multiple-beam system is, however, challenging. Electrostatic multipole deflectors and stigmators such as electrostatic quadrupoles and octupoles may be used for this purpose. However, it is difficult to sufficiently miniaturize electrostatic multipole devices and at the same time maintain excellent beam influencing properties and electrical field properties.

Further, also electrostatic multipole devices for single charged particle beam systems may suffer from an insufficient quality of the electrostatic fields which may lead to an increased spot size and impair the achievable spatial resolution of charged particle beam devices.

Accordingly, there is a need for electrostatic multipole devices which may provide excellent field qualities. Particularly, there is a need for miniaturized electrostatic multipole devices providing excellent field qualities which may also be used for influencing individual beamlets of multiple charged particle beams generated by a single beam source.

SUMMARY

In light of the above, according to the independent claims, an electrostatic multipole device and an electrostatic multipole arrangement with two or more electrostatic multipole devices are provided. Further, a charged particle beam device with at least one electrostatic multipole device is provided. According to a further aspect, methods of manufacturing an electrostatic multipole device are provided. Further aspects, advantages, and features of the embodiments are apparent from the dependent claims, the description, and the accompanying drawings.

According to embodiments described herein, an electrostatic multipole device for influencing a charged particle beam propagating along an optical axis is provided, including: a first electrical contact, a second electrical contact, and a high-resistance layer which extends at least partially around the optical axis and is configured to allow a current flow between the first electrical contact and the second electrical contact, wherein the first electrical contact contacts the high-resistance layer at a first circumferential position and is configured to provide a first potential to the first circumferential position, and wherein the second electrical contact contacts the high-resistance layer at a second circumferential position at an angular distance from the first circumferential position and is configured to provide a second potential to the second circumferential position.

According to a further aspect described herein, an electrostatic multipole arrangement for individually influencing at least a first and a second beamlet of charged particles propagating side-by-side along a main propagation direction is provided including: a first electrostatic multipole device for influencing the first beamlet, and a second electrostatic multipole device for influencing the second beamlet, which is arranged next to the first electrostatic multipole device in a transverse direction with respect to the main propagation direction. The first electrostatic multipole device includes: a first electrical contact, a second electrical contact, and a high-resistance layer which extends at least partially around the first beamlet propagation path and is configured to allow a current flow between the first electrical contact and the second electrical contact. The second electrostatic multipole device includes: a further first electrical contact, a further second electrical contact, and a further high-resistance layer which extends at least partially around the second beamlet propagation path and is configured to allow a current flow between the further first electrical contact and the further second electrical contact.

According to a further aspect described herein, a charged particle beam device is provided, including: a beam source for generating a charged particle beam propagating along an optical axis; and an electrostatic multipole device for influencing the charged particle beam, the electrostatic multipole device comprising: a first electrical contact, a second electrical contact, and a high-resistance layer which extends at least partially around the optical axis and is configured to allow a current flow between the first electrical contact and the second electrical contact, wherein the first electrical contact contacts the high-resistance layer at a first circumferential position and is configured to provide a first potential to the first circumferential position, and wherein the second electrical contact contacts the high-resistance layer at a second circumferential position at an angular distance from the first circumferential position and is configured to provide a second potential to the second circumferential position, wherein the multipole device is configured for at least one of deflecting, shaping, and correcting aberrations of the charged particle beam.

According to a further aspect described herein, a method of manufacturing an electrostatic multipole device for influencing a charged particle beam propagating along an optical axis is provided, including: providing a high-resistance layer, which extends in a circumferential direction at least partially around the optical axis, contacting the high-resistance layer at a first circumferential position with a first electrical contact configured to provide a first electrical potential to the first circumferential position, and contacting the high-resistance layer at a second circumferential position with a second electrical contact configured to provide a second electrical potential to the second circumferential position.

Embodiments are also directed at apparatuses for carrying out the disclosed methods and include apparatus parts for performing the individual method actions. This method may be performed by way of hardware components, a computer programmed by appropriate software, by any combination of the two or in any other manner. Furthermore, embodiments are also directed at methods of operating the described apparatus.

Further advantages, features, aspects and details that can be combined with embodiments described herein are evident from the dependent claims, the description and the drawings.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF EMBODIMENTS

Figure 1:
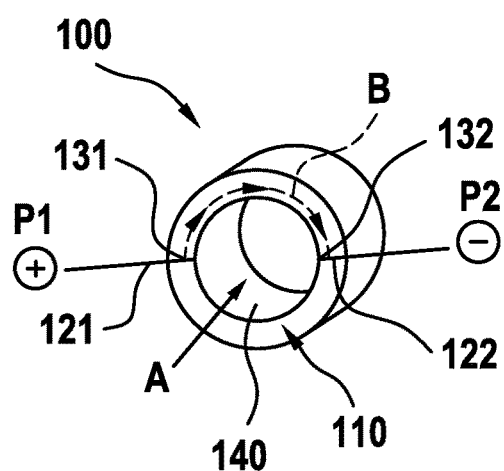
FIG. 1 shows an electrostatic multipole device with two electrical contacts according to embodiments described herein in a schematic view.

Reference will now be made in detail to the various embodiments, one or more examples of which are illustrated in the figures. Within the following description of the drawings, the same reference numbers refer to same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

Electrostatic multipole devices such as electrostatic quadrupole devices or electrostatic octupole devices may be used for correcting aberrations of beams of charged particles. For example, in an exemplary geometry, eight electrodes may be arranged, e.g. on the circumference of a circle, around the propagation path of the charged particle beam. For example, the electrodes may be equally spaced by 45° from each other. Depending on the desired influence on the charged particle beam, potentials of +V and −V may be alternately applied to the electrodes in order to provide for an octupole field for correcting an astigmatism of the charged particle beam. Alternatively, voltages of, e.g., +V, +√2/2V, 0, −√2/2V, −V, √2/2V, 0, +√2/2V may be applied to the electrodes in this order in the circumferential direction in order to provide for a dipole field suitable for deflecting the charged particle beam. In another example, four electrodes may be arranged, e.g. on the circumference of a circle, around the propagation path of the charged particle beam. For example, the electrodes may be equally spaced by 90° from each other in order to provide for an electrostatic quadrupole device. Potentials of +V and −V may be alternately applied to the electrodes in order to provide for a quadrupole field.

According to embodiments described herein, an electrostatic multipole device may be provided as a dipole, a quadrupole, an octupole or as an even higher order element such as a 20-pole. Each of these multipole devices may be configured to be connected to an electrical supply for providing electrical potentials to the individual electrodes of the multipole device. The multipole device can generate a lens function, when a common voltage is applied on all electrodes. Further, a deflection function for deflecting or bending the charged particle beam may be provided by applying an electrical field in a plane perpendicular or at an angle to the optical axis. Further, a stigmatism function to control the astigmatism of the charged particle beam may be provided by arranging two electrical quadrupoles rotated by 45°. Further functions such as beam aberration compensation are possible. Optionally, an electrical hexapole can be provided either by an additional supply on the octupole or by the integration of a higher order multipole (e.g. a 12-pole).

Generally, the performance and accuracy of an electrostatic multipole device can be increased by increasing the number of electrodes. For example, undesired decapole components of the fields can be avoided, if a large number of poles (N≥10) is provided. However, more electrodes generally lead to a complicated mechanical design and sophisticated supply electronics.

As the individual electrodes are to be set on different electrical potentials, the electrodes are generally electrically separated from each other and distance from each other. However, the quality of the electrical field generated by such multipole devices may not be sufficient, in particularly when used in miniaturized electron optical systems.

An electrostatic multipole device 100 according to embodiments described herein is shown in FIG. 1 in a schematic view. The illustrated multipole device 100 is provided as an electrostatic dipole device for influencing a charged particle beam propagating along an optical axis A and includes a first electrical contact 121 and a second electrical contact 122 provided at an angular distance (here: 180°) from the first electrical contact 121. Further, the electrostatic multipole device 100 includes a high-resistance layer 110 which extends at least partially around the optical axis A and is configured to allow a current flow B between the first electrical contact 121 and the second electrical contact 122.

The first electrical contact 121 contacts the high-resistance layer 110 at a first circumferential position 131 and is configured to provide a first electrical potential P1 to the first circumferential position 131, and the second electrical contact 122 contacts the high-resistance layer 110 at a second circumferential position at an angular distance from the first circumferential position 131 and is configured to provide a second electrical potential P2 to the second circumferential position 132.

In other words, the first electrical contact 121 and the second electrical contact 122 according to embodiments described herein are not electrically isolated from each other, but electrically connected to each other via the high-resistance layer 110 which allows a (small) current flow B between the electrical contacts. In some embodiments, the high-resistance layer may provide for an electrical resistance in the range or one or more GigaOhm (GΩ) or more between the first and second electrical contact, which may in some cases lead to a current flow B in the range of nanoAmpere (nA) or less between the first and second electrical contact, when different potentials are applied to the first and second electrical contacts.

In some embodiments, the electrical resistance between two electrical contacts 121, 122 which contact the high-resistance layer at two adjacent circumferential positions 131, 132, may be 100 MΩ or more, particularly 1 GΩ or more, more particularly 10 GΩ or more. In order to allow a (small) current to flow between the circumferential positions of the high-resistance layer, the electrical resistance between two electrical contacts 121, 122 which contact the high-resistance layer at two adjacent circumferential positions 131, 132, may be 1000 GΩ or less, particularly 100 GΩ or less.

As the high resistance layer electrically contacts the first electrical contact 121 and the second electrical contact 122 which are provided at different circumferential positions with respect to the optical axis, the high-resistance layer may at least partially surround the optical axis A. In the embodiment shown in FIG. 1, the high-resistance layer 110 entirely surrounds the optical axis. It is illustrated in, e.g., FIG. 3 that the high-resistance layer may only partially surround the optical axis A, e.g. over an angle of 180° or less. For example, the high-resistance layer 110 may surround the optical axis only in the angular range between the first electrical contact 121 and the second electrical contact 122 and/or between further electrical contacts.

Figure 2:
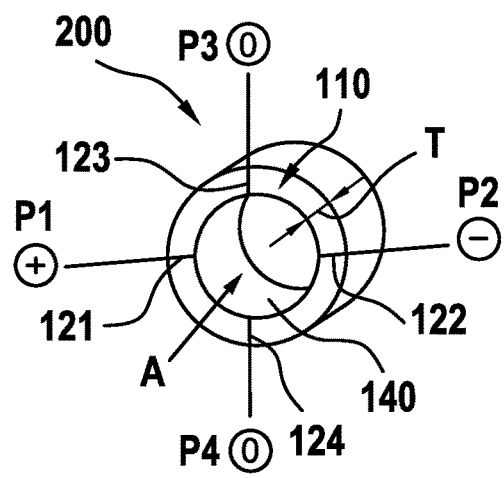
FIG. 2 shows an electrostatic multipole device with four electrical contacts according to embodiments described herein in a schematic view.
Figure 3:
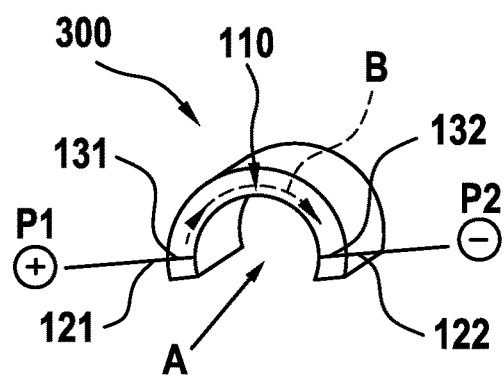
FIG. 3 shows an electrostatic multipole device with two electrical contacts according to embodiments described herein in a schematic view.

In some embodiments, the high-resistance layer may also mechanically connect the first and the second electrical contacts and be configured as a support structure for the electrical contacts. For example, a thickness of the high-resistance layer may be chosen such that the high-resistance layer itself forms a stable self-supporting body, e.g. a ring-shaped body as shown in FIGS. 1 to 3. In some implementations, a thickness of the high-resistance layer may be more than 1 mm or more than 1 cm so that the high-resistance layer forms a stable solid body, as is shown in FIG. 1. In this case, the electrical contacts may be held at predetermined angular distances with respect to each other at the high-resistance layer 110.

In some embodiments, the high-resistance layer may be provided as a coating on a support device, wherein the first and second electrical contacts are held on the support device in such a way that they electrically contact the high-resistance layer at the first and second circumferential positions, respectively. In this case, the support device may form a solid, self-supporting body, whereas the high-resistance layer may have a thickness of less than 1 mm, particularly less than 100 μm. For example, a high-resistance layer made of a high-conductivity material may be provided as a thin coating on a support device (<100 μm). On the other hand, a high-resistance layer made of a low-conductivity material may be provided as a thicker coating on a support device or as a self-supporting body, as is shown in FIG. 1.

As the high-resistance layer allows for a small current flow, according to embodiments described herein, electrons or other charged particles of the charged particle beam which may come into contact with the high-resistance layer 110 in the region between the first circumferential position 131 and the second circumferential position 132 will be discharged toward the first or second electrical contact. Thus, the surface of the high-resistance layer cannot get negatively or positively charged in localized surface regions. A surface charge between the electrical contacts would deteriorate the electrostatic field to be provided by the electrostatic multipole device 100. In contrast thereto, electrostatic multipole devices comprising a support with an insulating outer surface may collect charges on the surface which cannot flow away from the region between the electrodes. Therefore, the field quality of such multipole devices may deteriorate over time.

According to embodiments described herein, no surface charges can accumulate in the region between the electrodes due to the high-resistance layer 110 arranged and electrically connected therebetween.

According to some embodiments which may be combined with other embodiments described herein, a main surface 140 of the high-resistance layer extends in a circumferential direction at least partially and particularly completely around the optical axis A between the first circumferential position 131 and the layer 110 may face toward the propagation path of the charged particle beam. For example, as is shown in FIGS. 1 to 3, the main surface 140 of the high-resistance layer may extend parallel to the optical axis and perpendicular to a radial direction and may have an annular shape which partially or completely surrounds the optical axis A. Thus, the surface of the electrostatic multipole device which faces the charged particle beam and comes close to the charged particle beam during operation is made of a (weakly) conductive material, so that no surface charges may accumulate on said surface.

The high-resistance layer may at least partially surround the optical axis between the first electrical contact 121 which may be provided on a first electrical potential P1 (e.g., +V) and the second electrical contact 122 which may be provided on a second electrical potential P2 (e.g., −V). Therefore, the electrical potential may drop or increase along the extension direction of the high-resistance layer 110 from the first circumferential position 131, where the first potential P1 is applied to the high-resistance layer, to the second circumferential position 132, where the second potential P2 is applied to the high resistance layer. In other words, the geometrical shape of the high-resistance layer may define the spatial distribution of the potential around the optical axis from the first electrical contact to the second electrical contact.

For example, the high-resistance layer may be provided with a uniform thickness along the circumferential direction and with a circular cross-sectional shape around the optical axis. In this case, a potential can be obtained which may linearly drop or increase from P1 to P2 along a circular trajectory around the optical axis. Therefore, according to embodiments described herein, the geometrical characteristics of the resulting electrical field are not only defined by the electrical contacts, but by the shape and the electrical properties of the high-resistance layer extending between the electrical contacts. This allows for an optimization of the electrical field by adjusting the properties of the high-resistance layer.

In some embodiments, which may be combined with other embodiments described herein, the high-resistance layer comprises a material with a resistivity of $1\times10^6$ Ωm or more, particularly $1\times10^{-3}$ Ωm or more, more particularly $1\times10^2$ Ωm or more. In general, the resistivity of the high-resistance layer should be less than that of an insulator such as glass with a resistivity >$10^9$ Ωm (depending on impurities), e.g. smaller than $10^5$ Ωm, and should allow a small (typically nA) current to flow. The material of the high-resistance layer should also have a resistivity greater than a conductor such as platinum, $1.06\times10^{-7}$ Ωm to allow the power supply to maintain a voltage between the electrodes of the multipole device.

In other words, the resistivity of the material of the high-resistance layer may be higher than the resistivity of a typical conductor such as copper or silver, and the resistivity may be lower than the resistivity of a typical isolator such as glass or ceramics. The resistivity of the material of the high-resistance layer may depend on the thickness T of the high-resistance layer. For example, an electrical resistance between two adjacent electrical contacts in the range of GΩ may be obtainable with a thick high-resistance layer comprising a material with a high resistivity or with a thin high-resistance layer comprising a material with a low resistivity. The thickness T of the high-resistance layer may be measured in a radial direction with respect to the optical axis, i.e. in a direction perpendicular to the main surface 140 of the high-resistance layer.

Figure 4A:
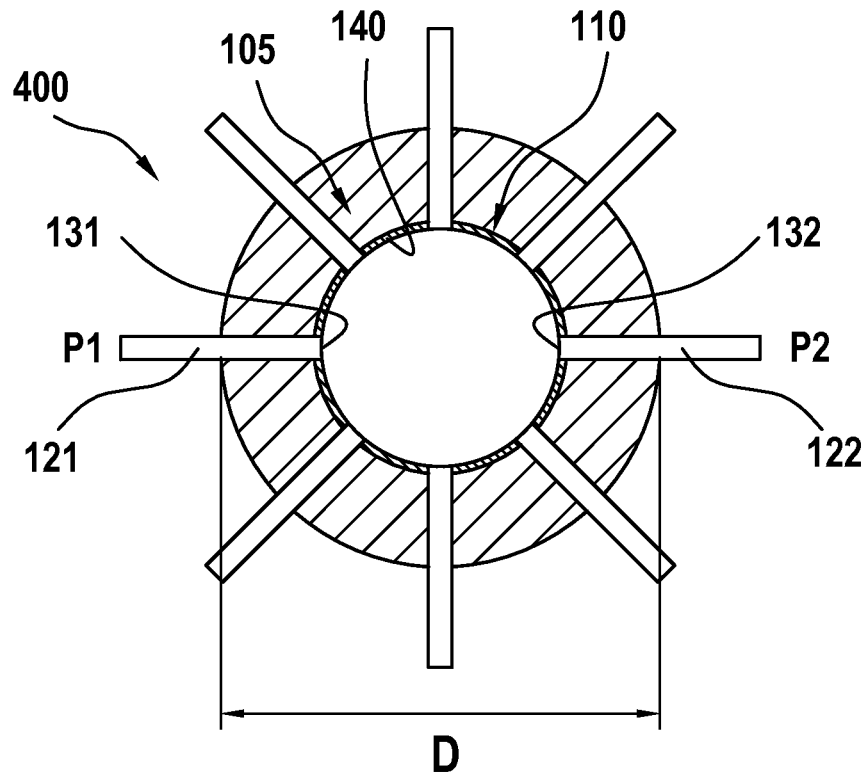
FIG. 4A shows an electrostatic multipole device with eight electrical contacts according to embodiments described herein in a schematic front view.

In some embodiments, the thickness T of the high-resistance layer 110 may be 10 nm or larger and/or 100 μm or smaller, particularly 100 nm or larger and/or 10 μm or smaller. A high-resistance layer with such a thickness may be provided as a coating on a support device, as is shown in FIG. 4A.

Additionally or alternatively, the material of the high-resistance layer may comprise or consist of carbon, doped carbon, or carbon with specified impurities for adjusting the resistivity as appropriate.

In order to obtain a linearly varying potential along a trajectory around the optical axis A, the high-resistance layer may have a uniform thickness T, particularly in the region between the first circumferential position 131 and the second circumferential position 132. In some embodiments, the high-resistance layer completely surrounds the optical axis A, and the T thickness of the high-resistance layer in a direction perpendicular to the main surface is essentially constant and uniform along the entire extension around the optical axis A.

FIG. 2 shows an electrostatic multipole device 200 according to embodiments described herein which is provided as a quadrupole device. The setup and the properties of the high-resistance layer 110 essentially correspond to the setup and the properties of the high-resistance layer 110 of the embodiment shown in FIG. 1 so that reference can be made to the above explanations.

The quadrupole device of FIG. 2 further comprises a third electrical contact 123 contacting the high-resistance layer 110 at a third circumferential position and configured to provide a third potential P3 to the third circumferential position, and a fourth electrical contact 124 contacting the high-resistance layer 110 at a fourth circumferential position and configured to provide a fourth potential P4 to the fourth circumferential position, wherein the first, second, third, and fourth electrical contacts 121, 122, 123, 124 may be provided at circumferential positions of 0° (+1-5°), 180° (+/−5°), 90° (+1-5°), and 270° (+/−5°), respectively. In other words, the circumferential positions, where the high-resistance layer 110 is contacted by electrical contacts, are arranged at equal angular distances of about 90°.

In the illustrated embodiment, an electrical potential of +V may be provided to the first circumferential position 131, an electrical potential of −V may be provided to the second circumferential position 132 which is arranged at an angle of 180° with respect to the first circumferential position, whereas electrical potentials of 0V may be provided to the third and fourth circumferential positions by the third and fourth electrical contacts 123, 124. In this case, the electrical potential may linearly drop along the main surface 140 of the high-resistance layer 110 from +V to 0V from the first circumferential position to the third circumferential position.

In other embodiments, more than four electrical contacts such as eight, twelve or twenty electrical contacts may be provided for contacting the high-resistance layer at respective circumferential positions in such a way that the circumferential positions are spaced apart at regular intervals in the circumferential direction.

FIG. 3 shows an electrostatic multipole device 300 according to embodiments described herein which is provided as a dipole device with a first electrical contact 121 and a second electrical contact 122. In this case, the high-resistance layer surrounds the optical axis by an angle of less than 360°, e.g. by 180°. An electrical current may flow through the high-resistance layer 110 from the first circumferential position 131 to the second circumferential position 132, and any accumulation of surface charges in a region between the electrical contacts may be avoided. The thickness and the material properties of the high resistance layer may correspond to the respective values of the embodiments shown in FIG. 1 and FIG. 2.

FIG. 4A shows an electrostatic multipole device 400 according to embodiments described herein which is provided as an octupole device. However, in some embodiments, the multipole device 400 may have less or more than eight electrodes.

The multipole device 400 includes a support device 105 which is at least partially coated with the high-resistance layer 110. In some embodiments, only a surface of the support device 105 which faces toward the optical axis A and extends parallel to the optical axis is coated with the high-resistance layer. In some embodiments, one or more side surfaces of the support device 105 which may extend perpendicularly to the optical axis A are coated with a high-resistance material. In some embodiments, the entire outer surface of the support device 105 may be coated with a high-resistance material so that an accumulation of surface charges on the multipole device surface may be reduced or entirely avoided.

For example, the outer surface of the support device may be entirely covered with a thin layer of a high-resistant material such as carbon, wherein the layer thickness can be in a range between 100 nm and 10 μm.

In some embodiments, which may be combined with other embodiments described herein, the support device 105 comprises a silicon wafer and/or a base plate made of an insulating material. In some embodiments, the support device 105 is at least partially coated with an insulating material, which may at least partially be coated with the high-resistance layer. In particular, the high-resistance layer may be coated onto an insulating surface. Such an arrangement may guarantee that a predetermined resistance between the individual electrical contacts is provided via the high-resistance layer.

For example, a support device such as a substrate may be coated with the high-resistance layer by a thin film deposition technique, e.g. by at least one of a physical deposition technique such as sputtering or a chemical deposition technique such as atomic layer deposition.

In the embodiment shown in FIG. 4A, the support device 105 comprises an opening for the charged particle beam, wherein at least a cylindrical inner surface of the opening is coated with the high-resistance layer 110. Thus, the main surface 140 of the high-resistance layer 110 extends parallel to the optical axis and entirely surrounds the optical axis A, without any gaps or discontinuities along the circumferential direction.

The opening of the support device 105 may have an inner diameter of less than 2 mm, particularly less than 1 mm. In order to avoid charged particles of the charged particle beam hitting on the high-resistance layer 110 or the electrical contacts, an aperture may be arranged upstream from the multipole device 400. The aperture may have an aperture opening with a diameter smaller than the inner diameter of the opening of the support device, e.g. 0.5 mm or smaller.

In some embodiments, which may be combined with other embodiments described herein, the cylindrical inner surface of the opening extends over more than 0.2 mm and/or less than 5 mm, particularly over more than 0.5 mm and/or less than 2 mm in the direction of the optical axis A. In other words, the high-resistance layer 110 may extend parallel to the optical axis over more than 0.2 mm and/or less than 5 mm. Thus, a multipole electric field which is essentially homogenous in the propagation direction may act on the charged particle beam over a distance of more than 0.2 mm. The effect of fringe fields which may be present at the entrance and at the exit of the opening may be decreased by providing a long propagation distance within the opening.

The outer shape of the support device 105 is not particularly restricted. However, a small outer dimension of the support device 105 is advantageous, because small multipole devices may be beneficially used for influencing individual beamlets of multiple charged particle beams. For example, the maximum outer dimension of the support device may be smaller than 2 mm or smaller than 1 mm. In some embodiments, the support device 105 is provided as a hollow cylinder with an outer diameter D of less than 2 mm, particularly with an outer diameter of less than 1 mm. A multipole device with a support device 105 in the form of a hollow cylinder is shown in FIG. 4A. This outer shape allows for a second electrostatic multipole device to be arranged in close vicinity to a first electrostatic multipole device so that two beamlets propagating side-by-side at a distance of 2 mm or less may be influenced individually.

The electrostatic octupole device shown in FIG. 4A includes a total of eight electrical contacts, wherein each electrical contact contacts the high-resistance layer 110 at an associated circumferential position. The circumferential positions may be spaced apart at regular intervals of 45°. At least one of the electrical contacts, e.g. the first electrical contact 121 and/or the second electrical contact 122 may be provided as a conducting line which extends in a radial direction toward or on top of the high-conductive layer. In some embodiments, each electrical contact is provided as a conducting line extending in a radial direction toward or on top of the high-conducting layer so that a star-shaped arrangement of conducting lines is provided, as can be recognized in the front view of FIG. 4A. The electrical contacts may comprise or consist of a conductive material such as copper, silver etc. which may have a lower resistivity than the material of the high-resistance layer.

In some embodiments, the electrical contacts 121, 122 may be provided on at least one side surface of the support device 105, e.g. on the surface directed toward an entrance side 152 of the opening and/or on the surface directed toward an exit side 154 of the opening. The side surface may have been previously coated with the high-resistance material.

In some embodiments, the electrical contacts 121, 122 may be applied to the support device 105, which may be coated afterwards at least partially with the high-resistance layer 110. The electrical contacts may be provided at least partially on top of and/or below a layer of high-conductive material.

Figure 4B:
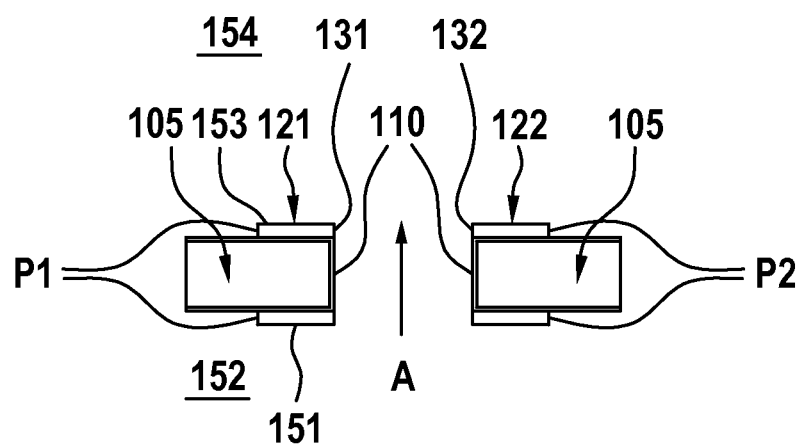
FIG. 4B shows the electrostatic multipole device of FIG. 4A in a sectional view.

As can clearly be seen in the sectional view of FIG. 4B, in some embodiments, at least one electrical contact includes a first conductive line 151 which radially extends at an entrance side 152 (upstream side) of the cylindrical opening and a second conductive line 153 which radially extends at an exit side 154 (downstream side) of the cylindrical opening at a corresponding angular position. Both the first conductive line 151 and the second conductive line 153 may contact the high-resistance layer 110 at the first circumferential position 131. During operation, the first conductive line 151 and the second conductive line 153 may be connected to the first electrical potential P1. By providing the first electrical contact 121 with two conductive lines contacting the high-resistance layer at opposing sides of the opening, the main surface 140 of the high-resistance layer 110 may be held at an essentially constant potential P1 at the first circumferential position 131 from the entrance side 152 through to the exit side 154. Thus, the potential on the main surface 140 of the high-resistance layer is essentially constant along the optical axis, whereas the potential may vary essentially linearly in the circumferential direction. Some or all other electrical contacts may have a corresponding configuration.

Figure 6:
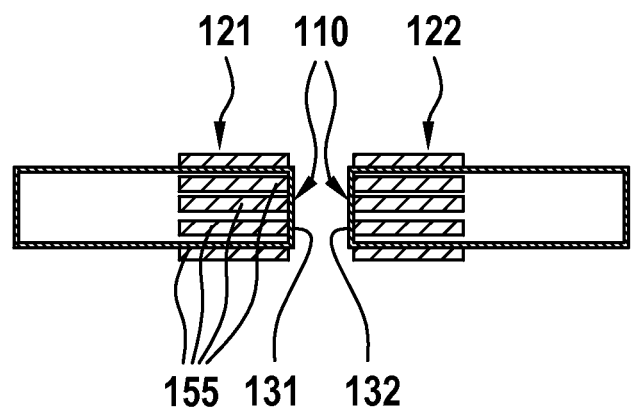
FIG. 6 shows an electrostatic multipole device according to embodiments described herein in a sectional view.

FIG. 6 shows an electrostatic multipole device which is similar to the electrostatic multipole device 400 shown in FIGS. 4A and 4B so that reference can be made to the above explanations. As is shown in the sectional view of FIG. 6, more than two conductive lines 155 are provided to contact the high-resistance layer 110 at the first circumferential position 131. All conductive lines 155 may be connected to the first electrical potential P1. The conductive lines may be provided as a layer stack extending in the direction of the optical axis A. Thus, the potential on the main surface of the high-resistance layer 110 is essentially constant along the optical axis A, whereas the potential may vary essentially linearly in the circumferential direction. Some or all other electrical contacts may have a corresponding layer structure.

Figure 7:
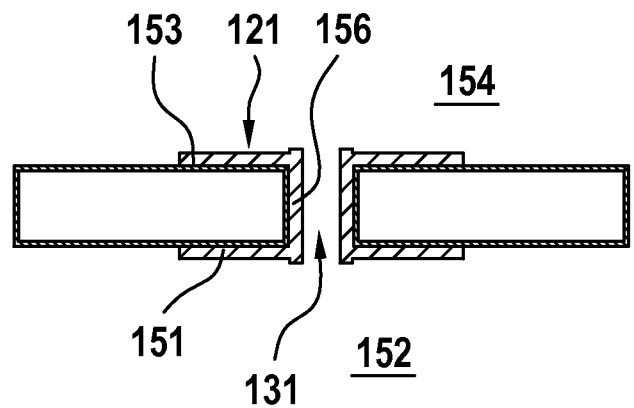
FIG. 7 shows an electrostatic multipole device according to embodiments described herein in a sectional view.

FIG. 7 shows an electrostatic multipole device which is similar to the electrostatic multipole device shown in FIGS. 4A and 4B so that reference can be made to the above explanations. As is shown in the sectional view of FIG. 7, the first electrical contact 121 includes at least three conductive lines (first conductive line 151, second conductive line 153, third conductive line 156), wherein the first conductive line 151 may extend on the entrance side 152 of the opening, the second conductive line 153 may extend on the exit side 154 of the opening, and the third conductive line 156 may extend on top of or below the high-resistance layer 110 parallel to the optical axis along the inner surface of the opening. The conductive lines 151, 153, 156 may be connected to the same electrical potential P1. Thus, the potential on the main surface of the high-resistance layer 110 is constant at the first circumferential position 131 along the optical axis A, whereas the potential may vary essentially linearly in the circumferential direction. The other electrical contacts may have a corresponding structure. In some embodiments, each electrical contact may be provided with a single conductive line extending on top of or below the high-resistance layer parallel to the optical axis along the inner surface side of the opening.

As is clearly shown in the front view of FIG. 4A, at least the first electrical contact 121 extends over an angular range of less than 30°, particularly less than 10°, more particularly less than 5°, or even 2° or less. In other words, the first circumferential position 131 at which the high-resistance layer 110 is contacted by the first electrical contact 121 has a small angular extension of less than 30° and particularly less than 2°. Particularly, all circumferential positions have small angular extensions of less than 30° and particularly less than 2°. Such an arrangement of electrical contacts with a small angular extension may avoid angular regions of constant electrical potential of the high-resistance layer. If the high-resistance layer is only essentially punctually contacted by the electrical contacts, the high-resistance layer itself may effectively act as a single, circumferentially extending electrode with an essentially linearly varying potential. Thus, e.g., a nearly perfect electric dipole may be generated by the octupole device of FIG. 4A, as will be explained with reference to FIG. 5A and FIG. 5B.

Figure 5A:
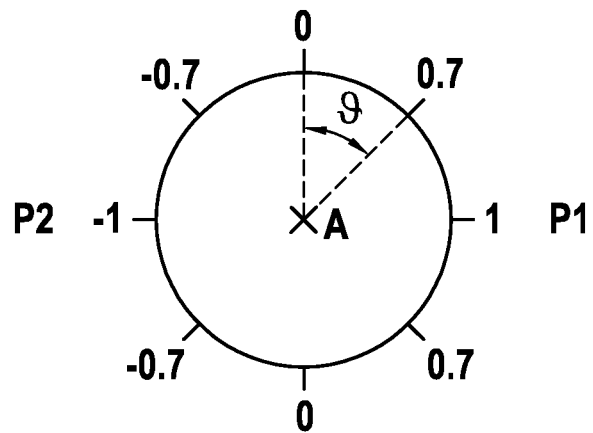
FIG. 5A shows an example of electrical potentials to be applied to the multipole device of FIG. 4A.
Figure 5B:
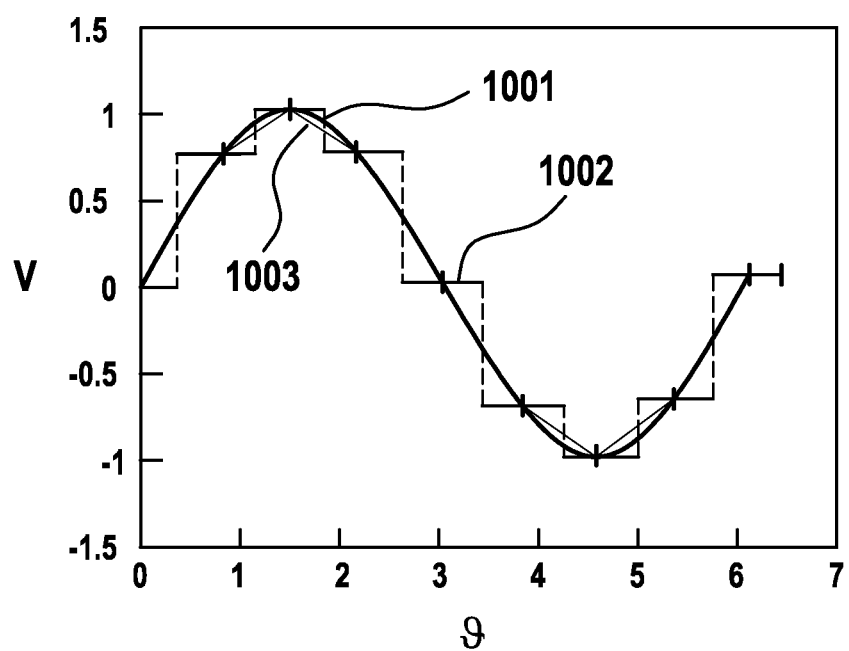
FIG. 5B is a graph showing an electrical potential in dependence of an angle θ in a circumferential direction around the optical axis of the multipole device shown in FIG. 4A.

As is shown in FIG. 5A, the following eight potentials (voltages) may be applied to the electrical contacts in the circumferential direction, in order to provide an electrical potential which comes close to a sine potential when following a circular trajectory: 1V, 0.7V, 0V, −0.7V, −1V, −0.7V, 0V, 0.7V, or an arbitrary multiple or factor thereof. FIG. 5B shows the voltage along the high-resistance layer as a function of the angle θ. Reference sign 1001 shows a perfect dipole field (sine wave). The horizontal lines 1002 are the voltages used on an octupole device with broad electrodes isolated from each other. Line 1003 is the expected voltage to be found using embodiments disclosed herein. It is to be noted that line 1003 is much closer to the perfect dipole sine curve than the horizontal lines 1002.

An electrostatic multipole device according to embodiments described herein and as illustrated in FIG. 4A in an exemplary way may provide the following additional advantages: There is no need for high aspect ratio etching between the electrical contacts so that the electrical contacts can be made particularly small. Further, the multipole devices can have more electrical contacts, e.g. 12 or 20 electrical contacts, and can correct for higher harmonics while still having a small overall extension of less than 2 mm. Still further, the multipole device may be longer so that fringe fields may have a less significant effect. Due to the high-resistance layer, there are no insulators visible to the charged particle beam, so that charging problems may be avoided. The multipole device may, e.g., be used as a deflector, stigmator, hexapole unit, spherical aberration corrector etc.

Figure 8:
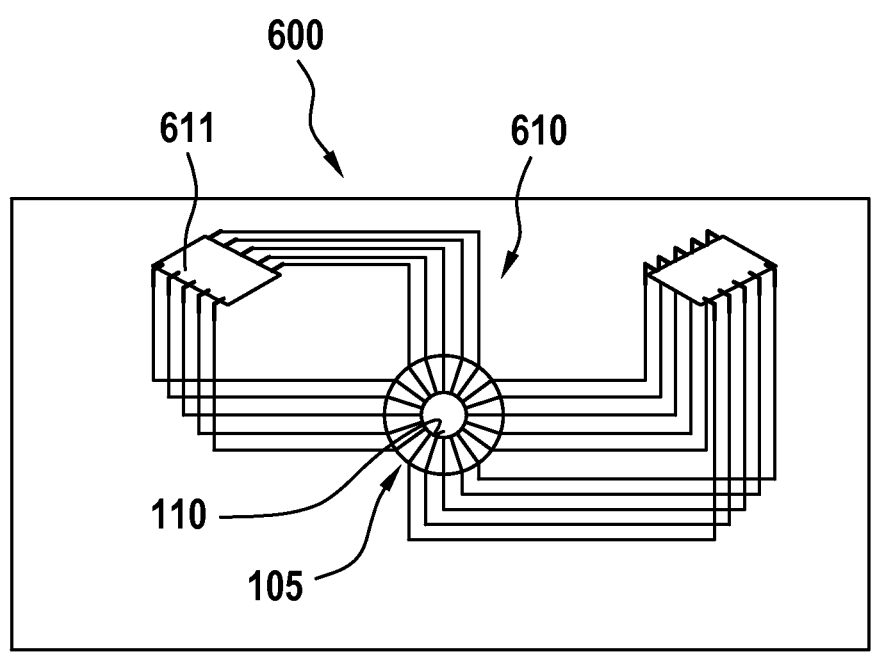
FIG. 8 shows an electrostatic multipole device with 20 electrical contacts provided on a chip with an integrated controller.

FIG. 8 shows an electrostatic multipole device 600 according to embodiments described herein comprising a total of twenty electrical contacts contacting the high-resistance layer 110 at circumferential positions arranged at regular intervals of 18°, respectively (20-pole-device). The support device 105 that is coated with the high-resistance layer 110 may be connected to or integrally formed with a board 610 (e.g. a PCB). Wiring of the 20 electrical contacts can be done on the surface of the board 610, and for 20-poles the voltages might be handled by at least one on-board integrated controller 611.

Figure 9A:
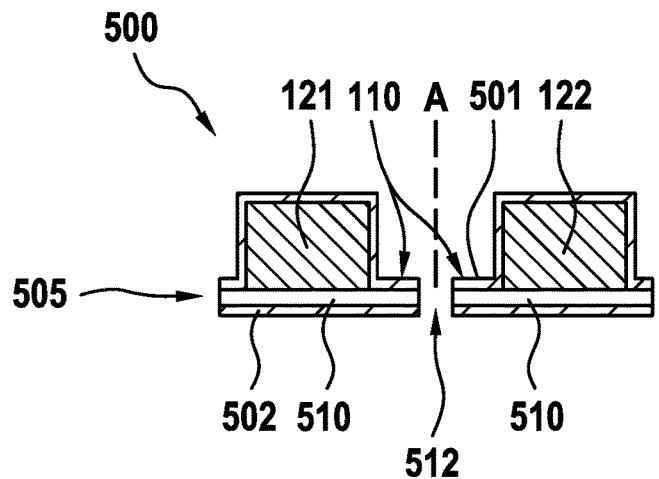
FIG. 9A shows an electrostatic multipole device according to embodiments described herein in a sectional view.
Figure 9B:
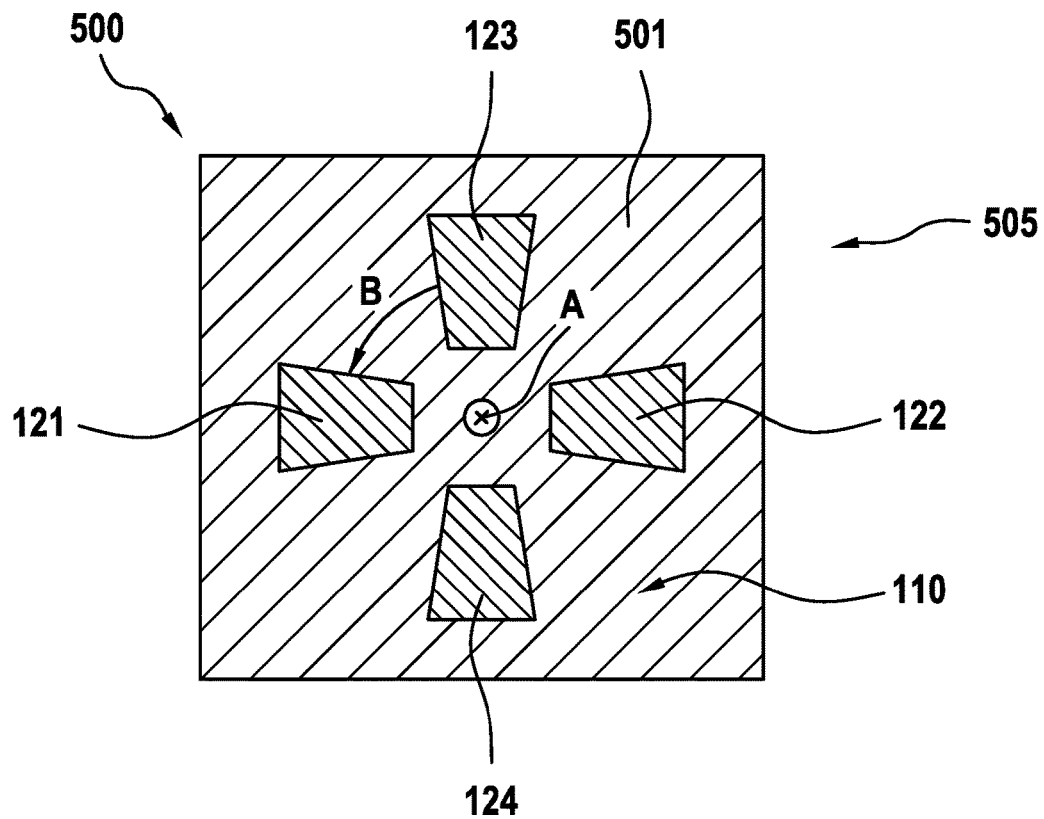
FIG. 9B shows the multipole device of FIG. 9A in a front view.

FIG. 9A shows an electrostatic multipole device 500 according to embodiments described herein in a sectional view. FIG. 9B shows the electrostatic multipole device 500 in a front view. The multipole device 500 is provided as a quadrupole device with a first electrical contact 121 arranged at 0° and configured to be connected to a first electrical potential, a second electrical contact 122 arranged at 180° and configured to be connected to a second electrical potential, a third electrical contact 123 arranged at 90° and configured to be connected to a third electrical potential, and a fourth electrical contact 124 arranged at 270° and configured to be connected to a fourth electrical potential. However, more or less than four electrical contacts may be provided.

The electrical contacts may be provided on a support device 505 in the form of a support plate 510. In some implementations, the support device 505 may be provided a support plate 510, e.g. a support plate 510 made of an insulating material, and the electrical contacts may be applied to an insulating surface of the support plate 510. In some embodiments, which may be combined with other embodiments described herein, the support plate 510 may at the same time have the effect of an aperture and be provided with a small aperture opening 512 for the charged particle beam in the center of the electrical contacts. The inner diameter of the opening may be smaller than the distance between two oppositely arranged electrical contacts, respectively.

At least one main surface 501 of the support device 505 may be coated with the high-resistance layer 110. In particular, the main surface 501 of the support device 505 and the electrical contacts 121, 122, 123, 124 provided thereon may be coated with the high-resistance layer 110 in order to allow for a current flow B between the electrical contacts. In the embodiment shown in FIG. 9A and FIG. 9B, the main surface of the high-resistance layer 110 does not extend in a circumferential direction between the electrical contacts, but in a perpendicular direction with respect to the optical axis A. Due to the GΩ resistance between two adjacent electrical contacts provided by the high-resistance layer 110, some nA of current may flow between two adjacent electrodes.

In some embodiments, not only the main surface 501 of the support device 505 carrying the electrical contacts may be coated, but also the opposite main surface may be coated with a high-resistance material 502 in order to make sure that no surface charges may accumulate on an insulating surface of the support device 505.

The high-resistance layer which electrically connects the electrical contacts with each other and which is arranged between the electrical contacts may in some embodiments extend perpendicular or at an angle with respect to the optical axis. In some embodiments, the high-resistance layer may additionally or alternatively extend parallel to the optical axis, e.g. as a coating provided on an inner cylindrical surface.

Figure 12:
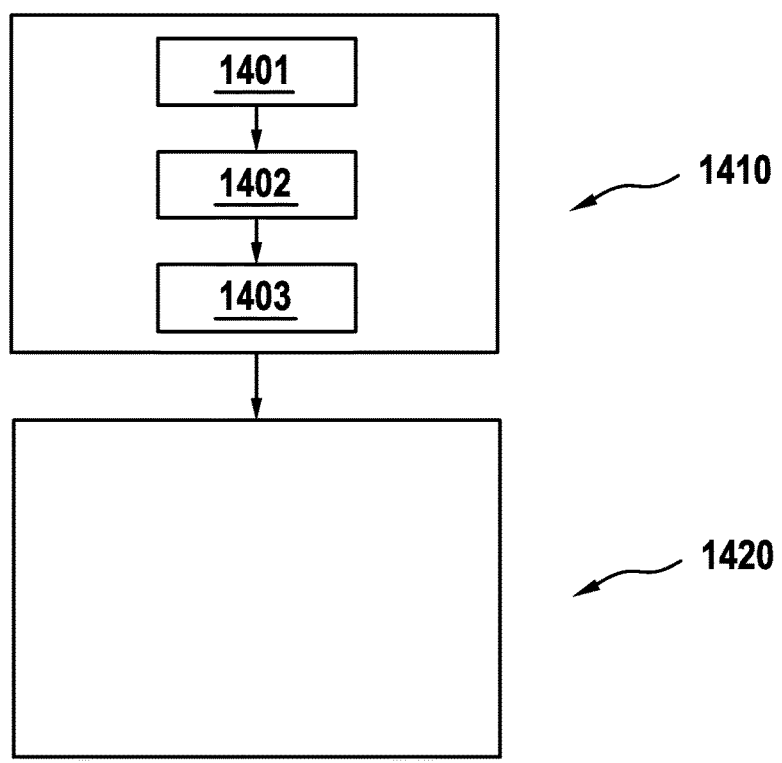
FIG. 12 is a flow diagram illustrating a method of manufacturing an electrostatic multipole device according to embodiments described herein.

According to a further aspect, a method of manufacturing an electrostatic multipole device for influencing a charged particle beam propagating along an optical axis is provided. FIG. 12 is a flow diagram illustrating a method of manufacturing an electrostatic multipole device, e.g., the electrostatic octupole device shown in FIG. 4A. In box 1410, a high-resistance layer is provided such that a main surface of the high resistance layer extends in a circumferential direction at least partially around the optical axis. In box 1420, the high-resistance layer is contacted at a first circumferential position with a first electrical contact configured to provide a first electrical potential to the first circumferential position, and the high-resistance layer is contacted at a second circumferential position with a second electrical contact configured to provide a second electrical potential to the second circumferential position. This allows a current flow between the electrical contacts via the high-resistance layer.

Providing the high-resistance layer in box 1410 may comprise, in box 1403, coating at least an inner surface of an opening provided in a support device such as a silicon wafer with the high-resistance layer.

Alternatively or additionally, providing the high-resistance layer in box 1410 may comprise, in box 1401, etching a support plate such as a silicon wafer in order to provide a support device with an opening, particularly with a cylindrical opening. In some embodiments, the support plate may be etched to provide the support device with the form of a hollow cylinder which may have an outer cylinder diameter of 2 mm or less and/or which may have an inner cylinder diameter of 1 mm or less.

Alternatively or additionally, providing the high-resistance layer in box 1410 may comprise, in box 1402, coating at least the inner surface of the opening provided in the support device with an insulator, and then coating the insulating layer with the high-resistance layer in box 1403.

Contacting the high-resistance layer in box 1420 may comprise applying lines of a conductive material on a front and/or on a rear surface of the support device. In some embodiments, the lines of conductive material may be applied on top of a layer of high-resistance material. In some embodiments, the lines of conductive material may extend radially with respect to the optical axis. In some embodiments, the lines of conductive material may alternatively or additionally extend parallel to the optical axis on an inner surface of the cylindrical opening.

The manufacturing method according to embodiments described herein may provide one or more of the following advantages: the likelihood of tolerancing errors in the manufacturing is reduced; the coating with the high-resistance layer may be provided such that no insulators are visible to the charged particle beam so that no charging problems may arise.

Figure 10:
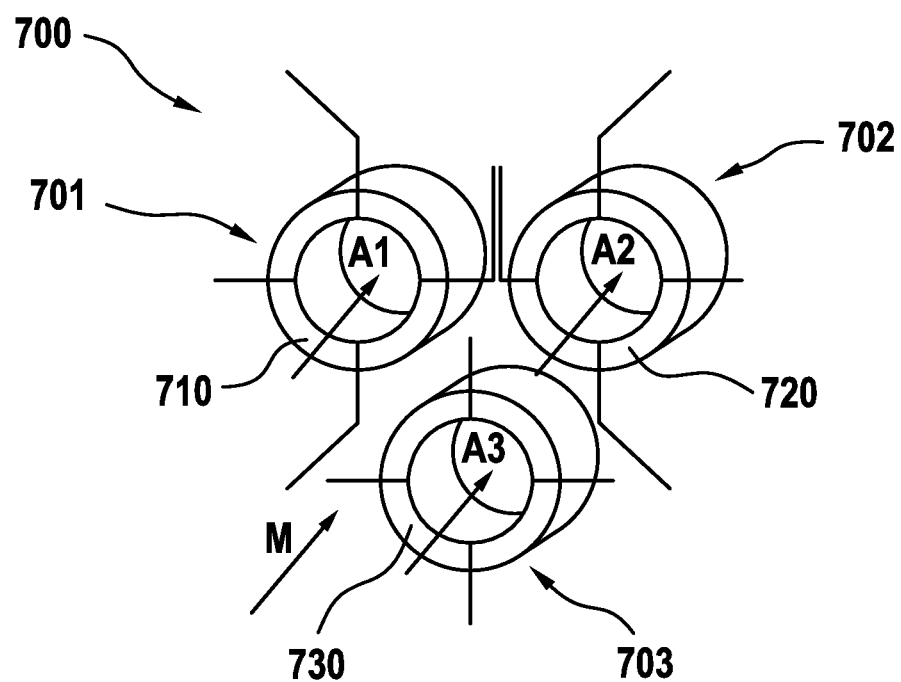
FIG. 10 shows an electrostatic multipole arrangement with three electrostatic multipole devices according to embodiments described herein in a schematic perspective view.

FIG. 10 shows an electrostatic multipole arrangement 700 according to embodiments described herein in a schematic perspective view. As an electrostatic multipole arrangement 700 may include two or more electrostatic multipole devices arranged in a predetermined pattern or array next to each other, the term "electrostatic multipole array" may be used instead of the term "electrostatic multipole arrangement".

The electrostatic multipole arrangement 700 is configured for individually influencing at least two beamlets of charged particles, e.g. a first beamlet, a second beamlet, and a third beamlet of charged particles propagating side-by-side along a main propagation direction M. The beamlets may propagate parallel with respect to each other. In some cases, the beamlets may propagate at an angle with respect to each other, e.g. at an angle smaller than 100 mrad, particularly smaller than 15 mrad. For example, the beamlets may come from a single beam source. In this case, the main propagation direction M may correspond to the main emission direction of the beam source.

The electrostatic multipole arrangement comprises a first electrostatic multipole device 701, a second electrostatic multipole device 702, and a third electrostatic multipole device 703 in accordance with any of the embodiments described herein. The first, second, and third electrostatic multipole devices 701, 702, 703 may be configured as dipole devices, quadrupole devices, octupole devices, 12-pole devices, 20-pole devices, as appropriate.

The first electrostatic multipole device 701 may be configured for influencing the first beamlet and includes a first high-resistance layer 710 at least partially surrounding a first beamlet propagation path A1, the second electrostatic multipole device 702 may be configured for influencing the second beamlet and includes a second high-resistance layer 720 at least partially surrounding a second beamlet propagation path A2, and the third electrostatic multipole device 703 may be configured for influencing the third beamlet and includes a third high-resistance layer 730 at least partially surrounding a third beamlet propagation path A3.

The distance between the centers of two neighboring electrostatic multipole devices may be less than 5 mm, particularly less than 3 mm, more particularly less than 2 mm. The centers of all electrostatic multipole devices may be located in a single plane which may extend perpendicularly with respect to the main propagation direction M of the beamlets. The electrostatic multipole devices may be held on a common support, e.g. on a common plate or board.

Figure 11:
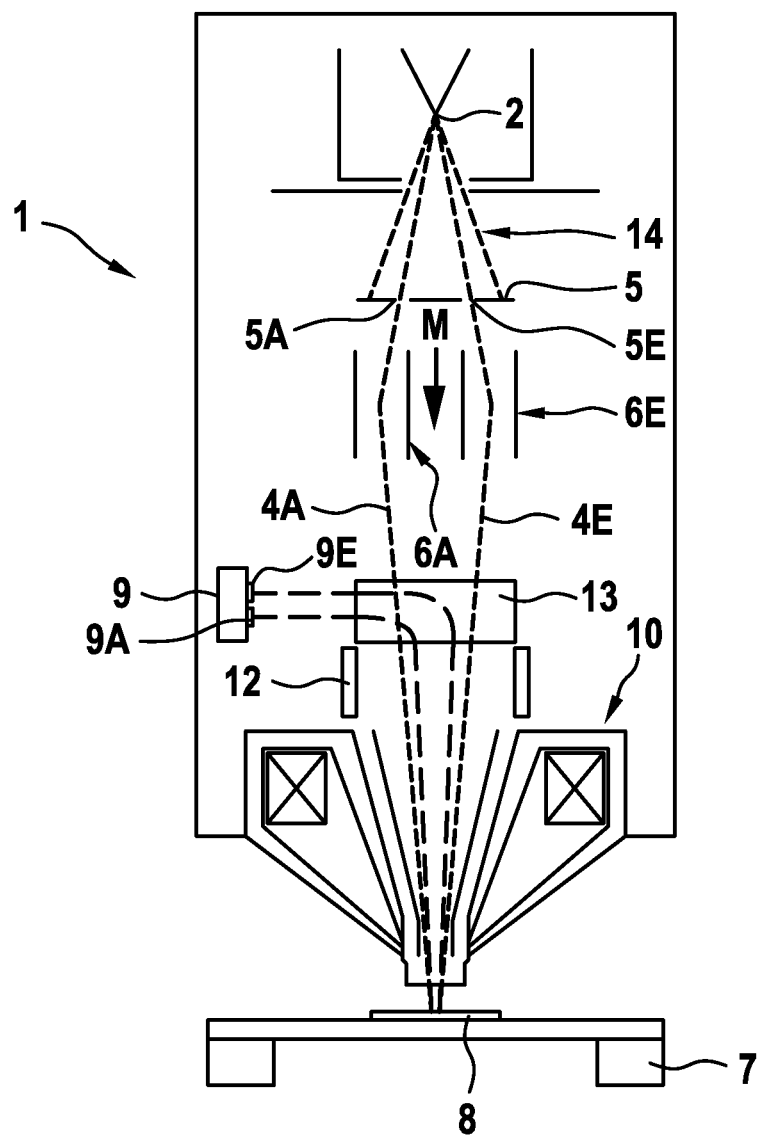
FIG. 11 shows a charged particle beam device with two electrostatic multipole devices according to embodiments described herein.

FIG. 11 shows a charged particle beam device 1 with five electrostatic multipole devices 6A-6E according to embodiments described herein, two of which (6A, 6E) are shown in the sectional plane of FIG. 11. In some embodiments, the charged particle beam device 1 may include only one electrostatic multipole device, or less or more than five electrostatic multipole devices. The electrostatic multipole devices may be provided as octupole devices.

In the embodiment shown in FIG. 11, each of the electrostatic multipole devices 6A-6E may be configured for at least one of deflecting, shaping, and correcting aberrations of one of five beamlets 4A-4E of a charged particles propagating side-by-side along a main propagation direction M.

A beam source 2 may be configured for emitting a charged particle beam 14. As described herein, a cold field emitter (CFE), a Schottky emitter, a TFE or another high current e-beam source may be provided, e.g. to increase the throughput. A high current is considered to be 10 μA in 100 mrad or above, for example up to 5 mA, e.g. 30 μA in 100 mrad to 1 mA in 100 mrad. According to typical implementations, the current is distributed essentially uniform, e.g. with a deviation of +−10%, particularly in the case of a linear or rectangular array. According to some embodiments, which can be combined with other embodiments described herein, the source or virtual source can have a diameter of 2 nm to 40 nm and/or have a typical emission half angle of 5 mrad or above, e.g. 50 mrad to 200 mrad. In some implementation, the beam source may be a high current, but low brightness source which may be useful for generating multiple beams.

According to yet further embodiments, which can be combined with other embodiments described herein, a TFE or another high reduced-brightness source, e.g. an e-beam source, capable of providing a large beam current is a source where the brightness does not fall by more than 20% of the maximum value when the emission angle is increased to provide a maximum of 10 μA-100 μA, for example 30 μA. Schottky or TFE emitters are currently available with a measured reduced-brightness of $5 \cdot 10^7$ $Am^{-2}(SR)^{-1}V^{-1}$, CFE emitters have a measured reduced-brightness of up to $5 \cdot 10^9$ $Am^{-2}(SR)^{-1}V^{-1}$. The system may also work with a carbide emitter such as a HfC which can have a reduced brightness of approximately $1 \cdot 10^{11}$ $Am^{-2}(SR)^{-1}V^{-1}$. For example, a beam, which has at least $5 \cdot 10^7$ $Am^{-2}(SR)^{-1}V^{-1}$ is beneficial.

After leaving the beam source 2, the generated charged particle beam 14 may pass through an aperture plate 5 having multiple aperture openings 5A-5E. The aperture openings can be situated along a ring on the aperture plate 5 or along any other arrangement such as a line, rectangle, or square. By passing through the aperture plate 5, multiple charged particle beams or beamlets 4A-4E are created. Thereafter, the electrostatic multipole deflectors 6A-6E are provided to influence the multiple beams of charged particles or beamlets 4A-4E so that each beamlet 4A-4E appears to come from a different source.

Thereafter, the charged particle beams or beamlets 4A-4E may pass a beam separator assembly 13, which may be configured to separate the primary beams from secondary beams or backscattered beams, i.e. signal beams.

Thereafter, the beamlets 4A-4E may pass the scanning deflector 12, which is, for example, used to move the charged particle beams in a raster over the surface of a specimen 8. After the scanning deflector 12, the beamlets 4A-4E enter the objective lens 10 that focuses the beamlets 4A-4E onto the specimen 8. The objective lens 10 not only focuses the beamlets 4A-4E, but also rotates the beamlets 4A-4E. However, this effect is not shown because it is difficult to depict in a two-dimensional drawing and because the skilled person is well aware of this additional effect. Due to the combined effects of the electrostatic multipole devices 6A-6E and the objective lens 10, multiple spots (images of the beam source 2), each corresponding to one of the beamlets 4A-4E, are created on the specimen 8.

When the beamlets 4A-4E strike the surface of the specimen 8, they undergo a series of complex interactions with the nuclei and electrons of the atoms of the specimen. The interactions produce a variety of secondary products, such as electrons of different energy, X-rays, heat, and light. Many of these secondary products are used to produce the images of the sample and to collect additional data. A secondary product of major importance to examination or the image formation of the specimen are secondary electrons that escape from the specimen 8 at a variety of angles with relatively low energy (1 to 50 eV). The signal electrons are extracted from the specimen through the objective lens 10, are separated from the primary beams in the beam separator assembly 13, and reach a detector assembly 9. The detector assembly 9 may include detector elements 9A-9E, which are configured for generation of a measurement signal, e.g. an electronic signal corresponding to the detected signal electrons.

By scanning the beamlets 4A-4E over the specimen 8 and displaying/recording the output of the detector assembly 9 or detector elements 9A-9E, multiple independent images of the surface of the specimen 8 are generated. Each image contains information about a different portion of the surface of the specimen. Accordingly, the speed of the data acquisition is increased with regard to the conventional single beam case. The specimen 8 may be supported on a stage 7 (specimen support) which is moveable horizontally in all directions, in order to allow the beamlets 4A-4E to reach the target areas on the specimen which are to be examined. The stage can also move in a first direction while the beams are scanned in a second direction. This will improve throughput further, since stage settling time may be reduced.

In order to improve the performance of the system, the embodiment shown in FIG. 11 may contain an objective lens 10, which is a combination of a magnetic lens and an electrostatic lens. Accordingly, the objective lens 10 is a compound magnetic-electrostatic lens. The electrostatic part of the compound magnetic-electrostatic lens may be an electrostatic retarding lens. Using such a compound magnetic-electrostatic lens yields superior resolution at low landing energies, such as a few hundred electron volts in the case of an SEM. Such low landing energies are desirable, especially in modern semiconductor industry, to avoid charging and/or damaging of radiation sensitive specimen. However, in some cases, only a magnetic lens or only an electrostatic lens may be used.

According to embodiments described herein, a single-beam column with a single charged particle beam may be provided. According to some embodiments, a multi-beamlet column may be provided with a number of beams, such as two or more, or 5 or more, or 8 or more, according to some examples, up to 200. The multi-beamlet column is configured such that the multi-beamlet column can also be arrayed in a multi-column system. Arraying multiple columns then provides an even higher number of beamlets working on the same sample (e.g. a wafer or a mask).

According to embodiments described herein, the primary electron beams and the secondary or signal electron beams are separated; particularly the signal electron detection is conducted off-axis, i.e. off-axis with respect to the optical axis defined by the objective lens. An efficient detection with negligible crosstalk between the different signals and a small or no effect on the primary beam performance can be provided. According to yet further embodiments, which can be combined with other embodiments described herein, the pitch of the primary beams on the sample is large enough that the pitch of the signal-electron-beamlets is sufficient such that the signal electron detection can be performed without or at least with negligible crosstalk. For example, the pitch on the specimen, e.g. a wafer, i.e. a minimal distance between two primary beamlets on the specimen, can be 10 μm or above, for example 40 mm to 100 mm. Accordingly, embodiments provide a multi-beam device which generates a reasonable number of primary electron beamlets within one electron optical column, wherein crosstalk is reduced, and which optionally provides the opportunity to array several of the multi-beam devices, i.e. multiple of the columns. Accordingly, it is further intended to have the option to array multi beamlet columns in a multi-column module (MCM).

While the foregoing is directed to embodiments of the invention, other and further embodiments may be devised without departing from the basic scope thereof, and the scope thereof is determined by the claims that follow.

The invention claimed is:

1. An electrostatic multipole device for influencing a charged particle beam propagating along an optical axis, the multipole device comprising:
   a first electrical contact, a second electrical contact, and
   a high-resistance layer which extends at least partially around the optical axis and is configured to allow a current flow between the first electrical contact and the second electrical contact,
   wherein the first electrical contact contacts the high-resistance layer at a first circumferential position and is configured to provide a first potential to the first circumferential position, and
   wherein the second electrical contact contacts the high-resistance layer at a second circumferential position at an angular distance from the first circumferential position and is configured to provide a second potential to the second circumferential position.

2. The electrostatic multipole device of claim 1, wherein a main surface of the high-resistance layer extends in a circumferential direction with respect to the optical axis between the first circumferential position and the second circumferential position.

3. The multipole device of claim 1, wherein the high-resistance layer comprises a material with a resistivity of $1 \times 10^6$ Ωm or more and $1 \times 10^9$ Ωm or less.

4. The multipole device of claim 1, wherein the high-resistance layer has a uniform thickness along the circumferential direction.

5. The multipole device of claim 1, wherein the thickness of the high-resistance layer is larger than 10 nm and smaller than 100 μm.

6. The multipole device of claim 1, wherein the high-resistance layer comprises carbon.

7. The multipole device of claim 1, wherein the high resistance layer completely surrounds the optical axis.

8. The multipole device of claim 1, further comprising a support device which is at least partially coated with the high-resistance layer.

9. The multipole device of claim 8, wherein the support device comprises an opening for the charged particle beam, wherein at least a cylindrical inner surface of the opening is coated with the high-resistance layer.

10. The multipole device of claim 9, wherein the cylindrical inner surface of the opening extends over more than 0.2 mm and less than 5 mm in a direction of the optical axis.

11. The multipole device of claim 9, wherein at least one of the first electrical contact and the second electrical contact is provided with a first radially extending conductive line extending at an entrance side of the opening and a second radially extending conductive line extending at an exit side of the opening.

12. The multipole device of claim 8, wherein the support device is provided as a hollow cylinder with an outer diameter of less than 2 mm.

13. The multipole device of claim 8, wherein the support device is at least partially coated with an insulator, which is at least partially coated with the high-resistance layer.

14. The multipole device of claim 1, further comprising:
   a third electrical contact contacting the high-resistance layer at a third circumferential position and configured to provide a third potential to the third circumferential position; and
   a fourth electrical contact contacting the high-resistance layer at a fourth circumferential position and configured to provide a fourth potential to the fourth circumferential position; and
   wherein the first, second, third, and fourth electrical contacts are provided at circumferential positions of 0°, 90°, 180°, and 270°, respectively, to form a quadrupole device.

15. The multipole device of claim 1, comprising a total of eight, twelve, twenty or more electrical contacts, wherein each electrical contact contacts the high-resistance layer at a respective circumferential position such that the electrical contacts are spaced apart at regular intervals in a circumferential direction.

16. The multipole device of claim 1, wherein at least one of the first electrical contact and the second electrical contact extend over an angular range of less than 30°, or less than 2°.

17. An electrostatic multipole arrangement for individually influencing at least a first and a second beamlet of charged particles propagating side-by-side along a main propagation direction, the electrostatic multipole arrangement comprising:
   a first electrostatic multipole device according to claim 1 for influencing the first beamlet of charged particles,
   a second electrostatic multipole device according to claim 1 for influencing the second beamlet of charged particles, which is arranged next to the first electrostatic multipole device in a transverse direction with respect to the main propagation direction.

18. A charged particle beam device, comprising:
   a beam source for generating a charged particle beam propagating along an optical axis; and
   an electrostatic multipole device for influencing the charged particle beam, the multipole device comprising:
      a first electrical contact and a second electrical contact, and
      a high-resistance layer which extends at least partially around the optical axis and is configured to allow a current flow between the first electrical contact and the second electrical contact, wherein the first electrical contact contacts the high-resistance layer at a first circumferential position and is configured to provide a first potential to the first circumferential position, and wherein the second electrical contact contacts the high-resistance layer at a second circumferential position at an angular distance from the first circumferential position and is configured to provide a second potential to the second circumferential position, wherein the electrostatic multipole device is configured for at least one of deflecting, shaping, and correcting aberrations of the charged particle beam.

19. A method of manufacturing an electrostatic multipole device for influencing a charged particle beam propagating along an optical axis, the method comprising:

providing a high-resistance layer, which extends in a circumferential direction at least partially around the optical axis, contacting the high-resistance layer at a first circumferential position with a first electrical contact configured to provide a first electrical potential to the first circumferential position, and contacting the high-resistance layer at a second circumferential position with a second electrical contact configured to provide a second electrical potential to the second circumferential position.

20. The method of claim 19, wherein providing the high-resistance layer comprises:

coating at least a cylindrical inner surface of an opening provided in a support device with the high-resistance layer.

\* \* \* \* \*